US008890185B2

(12) United States Patent
Yamada et al.

(10) Patent No.: US 8,890,185 B2
(45) Date of Patent: Nov. 18, 2014

(54) NITRIDE-BASED SEMICONDUCTOR LIGHT-EMITTING ELEMENT

(71) Applicant: Panasonic Corporation, Osaka (JP)

(72) Inventors: Atsushi Yamada, Osaka (JP); Akira Inoue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/868,368

(22) Filed: Apr. 23, 2013

(65) Prior Publication Data

US 2013/0234179 A1 Sep. 12, 2013

Related U.S. Application Data

(63) Continuation of application No. PCT/JP2012/004102, filed on Jun. 25, 2012.

(30) Foreign Application Priority Data

Jun. 27, 2011 (JP) ................. 2011-142043

(51) Int. Cl.
*H01L 33/00* (2010.01)
*H01L 33/16* (2010.01)
*H01L 33/20* (2010.01)

(52) U.S. Cl.
CPC ............... *H01L 33/16* (2013.01); *H01L 33/20* (2013.01); *H01L 33/0075* (2013.01)
USPC 257/95; 257/98; 257/E33.057; 257/E33.073; 257/E33.074; 438/22; 438/31; 438/32

(58) Field of Classification Search
USPC ............... 257/95, 98, E33.057, E33.073, 257/E33.074; 438/22, 31, 32
See application file for complete search history.

(56) References Cited

U.S. PATENT DOCUMENTS

2005/0156189 A1* 7/2005 Deguchi et al. ............... 257/103
2005/0285132 A1 12/2005 Orita (Continued)

FOREIGN PATENT DOCUMENTS

JP 2004-363343 A 12/2004
JP 2006-049855 A 2/2006

(Continued)

OTHER PUBLICATIONS

International Search Report for corresponding International Application No. PCT/JP2012/004102 mailed Jul. 24, 2012.

(Continued)

*Primary Examiner* — Su Kim
(74) *Attorney, Agent, or Firm* — Renner, Otto, Boisselle & Sklar, LLP

(57) ABSTRACT

A nitride-based semiconductor light-emitting element disclosed in the present application includes: an active layer having a growing plane which is an m-plane and which is made of a GaN-based semiconductor; and at least one radiation surface at which light from the active layer is to be radiated. The radiation surface has a plurality of protrusions on the m-plane. A base of each of the plurality of protrusions is a region inside a closed curve, and a shape of the base has a major axis and a minor axis. An angle between the major axis and an extending direction of an a-axis of a crystal is not more than 45°.

10 Claims, 14 Drawing Sheets

(56) References Cited

U.S. PATENT DOCUMENTS

| | | |
|---|---|---|
| 2006/0060868 A1 | 3/2006 | Orita |
| 2006/0175625 A1 | 8/2006 | Yokotani et al. |
| 2007/0085102 A1 | 4/2007 | Orita |
| 2008/0258156 A1 | 10/2008 | Hata |
| 2009/0095973 A1* | 4/2009 | Tanaka et al. .................. 257/99 |
| 2009/0146170 A1* | 6/2009 | Zhong et al. .................. 257/98 |
| 2009/0200563 A1 | 8/2009 | Goshonoo et al. |
| 2010/0059772 A1 | 3/2010 | Yamanaka |
| 2010/0244079 A1 | 9/2010 | Orita |

FOREIGN PATENT DOCUMENTS

| | | |
|---|---|---|
| JP | 2006-294907 A | 10/2006 |
| JP | 2007-273506 A | 10/2007 |
| JP | 2008-091664 A | 4/2008 |
| JP | 2008-305971 A | 12/2008 |
| JP | 2009-218569 A | 9/2009 |
| JP | 2009-253047 A | 10/2009 |
| JP | 2010-147056 A | 7/2010 |
| JP | 2010-219163 A | 9/2010 |
| WO | 03/100873 A1 | 12/2003 |

OTHER PUBLICATIONS

Masui et al., "Optical polarization characteristics of InGaN/GaN light-emitting diodes fabricated on GaN substrates oriented between (1010) and (1011) planes", Applied Physics Letters 92 (2008) 091105.

* cited by examiner

● N
◐ Ga

DISTRIBUTION OF EMISSION
IN PLANE INCLUDING A-AXIS

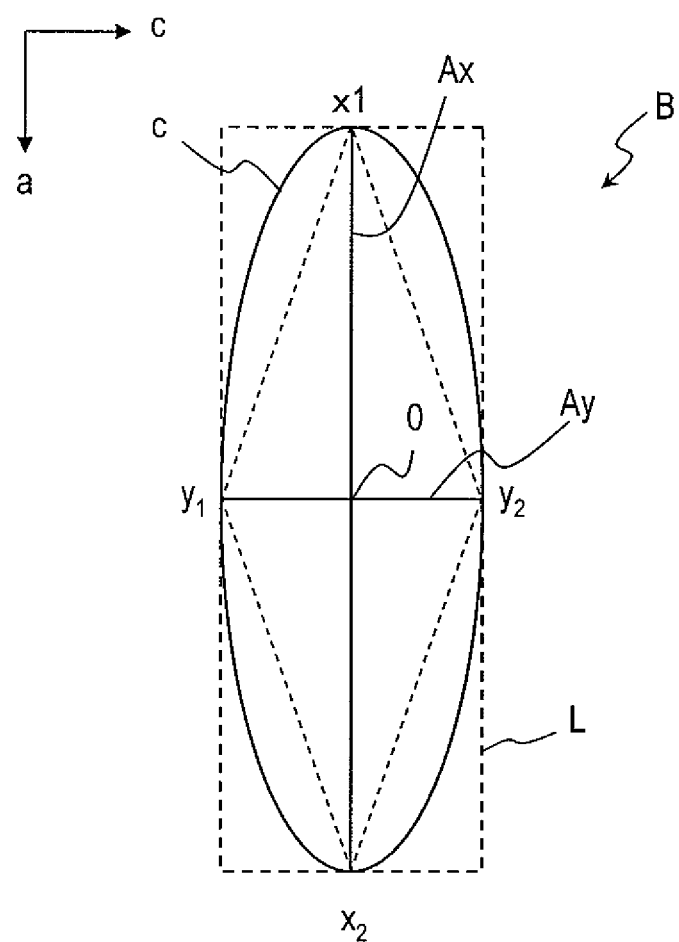

DIRECTION OF LIGHT EXTRACTION

NITRIDE-BASED SEMICONDUCTOR LIGHT-EMITTING ELEMENT

This is a continuation of International Application No. PCT/JP2012/004102, with an international filing date of Jun. 25, 2012, which claims priority of Japanese Patent Application No. 2011-142043, filed on Jun. 27, 2011, the contents of which are hereby incorporated by reference.

BACKGROUND

1. Technical Field

The present application relates to a nitride-based semiconductor light-emitting element and particularly to a semiconductor light-emitting element having a principal surface which is the m-plane.

2. Description of the Related Art

A nitride semiconductor including nitrogen (N) as a Group V element is a prime candidate for a material to make a short-wave light-emitting element because of its wide bandgap. Among other things, gallium nitride-based compound semiconductors (GaN-based semiconductors) have been researched and developed particularly extensively. As a result, blue light-emitting diodes (LEDs), green LEDs, and semiconductor laser diodes made of GaN-based semiconductors have already been used in actual products.

A GaN-based semiconductor has a wurtzite crystal structure. FIG. 1 schematically illustrates a single cell of GaN. In an $Al_xGa_yIn_zN$ ($x+y+z=1$, $x\geq0$, $y\geq0$, $z\geq0$) semiconductor crystal, some of the Ga atoms shown in FIG. 1 may be replaced with Al and/or In atoms.

FIG. 2 shows four vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a substrate having a principal surface which is a c-plane, i.e., a (0001) plane, is commonly used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated along the c-axis direction in the InGaN quantum well direction in the active layer. Once such a piezoelectric field has been generated in the active layer, some positional deviation occurs in the distributions of electrons and holes in the active layer due to the quantum confinement Stark effect of carriers. Consequently, the internal quantum efficiency decreases. Thus, in the case of a semiconductor laser diode, the threshold current increases. In the case of an LED, the power consumption increases, and the luminous efficacy decreases. Meanwhile, as the density of injected carriers increases, the piezoelectric field is screened, thus varying the emission wavelength, too.

Thus, to overcome these problems, it has been proposed that a substrate having the principal surface which is a non-polar plane such as a (10-10) plane that is perpendicular to the [10-10] direction and that is called an "m-plane" be used. As used herein, "−" attached on the left-hand side of a Miller-Bravais index in the parentheses means a "bar" (a negative direction index). As shown in FIG. 2, the m-plane is parallel to the c-axis (primitive vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above.

The "m-plane" is a generic term that collectively refers to a family of planes including (10-10), (−1010), (1-100), (−1100), (01-10) and (0-110) planes. As used herein, the "X-plane growth" means epitaxial growth that is produced perpendicularly to the X plane (where X=c, m, etc.) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

Thus, for example, an LED which is manufactured using such a substrate that has a non-polar plane can have improved emission efficiency as compared with a conventional device which is manufactured on a c-plane.

Further, as disclosed in APPLIED PHYSICS LETTERS 92 (2008) 091105, for example, a LED which includes an active layer formed on the m-plane has unique emission characteristics which are attributed to the structure of its valence band. The band structure of the m-plane InGaN of a light-emitting layer has a strain which is attributed to a lattice mismatch. Due to this strain, the valence band is split. One of the split valence bands which has the highest energy has a track which is similar to $p_x$, and therefore, light which is polarized in the a-axis direction is radiated. This polarized light has a possibility that the energy efficiency is greatly improved when employed in a backlight of a liquid crystal device.

Also, to improve the light extraction efficiency of a conventional c-plane LED, for example, a manufacturing method has been proposed which includes performing wet etching on the rear surface of a growth substrate so as to form recesses and protrusions (Japanese Laid-Open Patent Publication No. 2009-218569).

As for the size of a transparent structure portion, a configuration has been proposed in which the ratio between the horizontal dimension and the dimension along the thickness direction (aspect ratio) is not less than 5 and which has a light-scattering function on the surface of a light-emitting element chip or in the inside of the transparent structure portion (Japanese Laid-Open Patent Publication No. 2007-273506).

Further, a gallium nitride-based compound semiconductor light-emitting element including stacked layers of gallium nitride-based compound semiconductors on a substrate, characterized in that a light extraction surface is formed by a transparent film, and a surface of the transparent film has recesses and elevations that have been formed by flat surfaces inclined with respect to the substrate surface, has been proposed (Japanese Laid-Open Patent Publication No. 2006-294907).

Further, a light-emitting element including a transparent inorganic element and a phosphor, characterized in that a first layer, a second layer, and a third layer which has a smaller refractive index than the second layer are stacked, and that the first layer is an aggregate of dots which have the shape of a shell-like lens and is placed on the light-emitting element, has been proposed (Japanese Laid-Open Patent Publication No. 2004-363343).

SUMMARY

In the above-described conventional techniques, further improvement of the light distribution has been demanded.

One nonlimiting exemplary embodiment of the present application improves the light distribution of a nitride-based semiconductor light-emitting element including a light-emitting layer having a growing plane which is the m-plane.

One embodiment of the present invention is a nitride-based semiconductor light-emitting element, including: a light-emitting layer having a growing plane which is the m-plane and which is made of a GaN-based semiconductor; and at least one radiation surface at which light from the light-emitting layer is to be radiated, wherein the radiation surface is a surface in which a plurality of protrusions are provided on the m-plane, in the radiation surface, a base of each of the plurality of protrusions is a region inside a closed curve, a shape of the base has a major axis which is a line segment extending between two points which are at most distant positions on the closed curve and a minor axis which is a line segment passing through a center of the major axis and intersecting with the major axis at right angles, and an angle between the major axis and an extending direction of an a-axis of a crystal is not more than 45°.

In a nitride-based semiconductor light-emitting element according to an embodiment of the present invention, the light distribution characteristics of light from a light-emitting layer having a principal surface which is the m-plane are close to the Lambertian shape, so that the light distribution characteristics can be improved.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 6 is a diagram showing the base B of an protrusion 303.

DETAILED DESCRIPTION

Firstly, one noticed aspect is described based on which the present invention was conceived.

The present inventors discovered that, in a nitride-based semiconductor light-emitting element including a light-emitting layer having a principal surface which is the m-plane, there is a distinctive deviation in the light distribution, and this light distribution is greatly different from the light distribution of a conventional nitride-based semiconductor light-emitting element including a light-emitting layer having a principal surface which is the c-plane.

This deviation in the light distribution is attributed to the same principle as the above-described mechanism of emission of polarized light. Emission of light is caused by combination of holes and electrons in a semiconductor. This is interpreted, in the context of optics, as a vibratory motion of an electric dipole. In the case of the M-plane, this vibratory motion is limited to the a-axis direction due to split of the track of the valence band. Therefore, light which is polarized in the a-axis direction is emitted.

Figure 1:
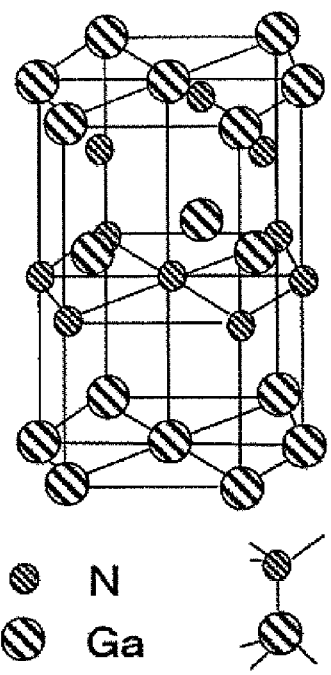
FIG. 1 is a perspective view schematically illustrating a unit cell of GaN.
Figure 2:
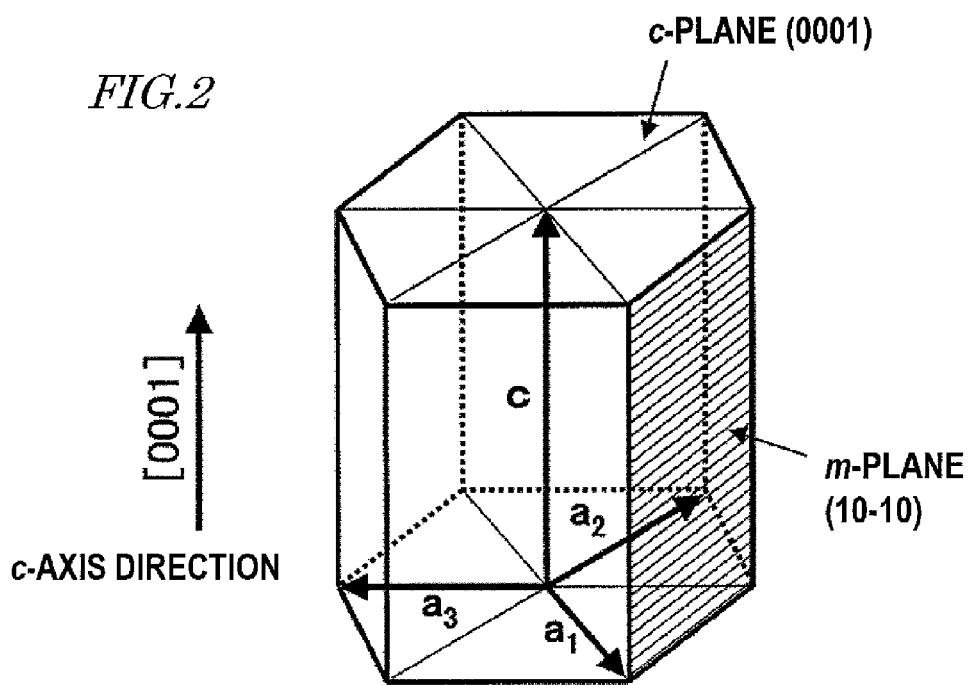
FIG. 2 is a perspective view showing primitive vectors $a_1$, $a_2$, $a_3$, and c representing a wurtzite crystal structure.
Figure 3:
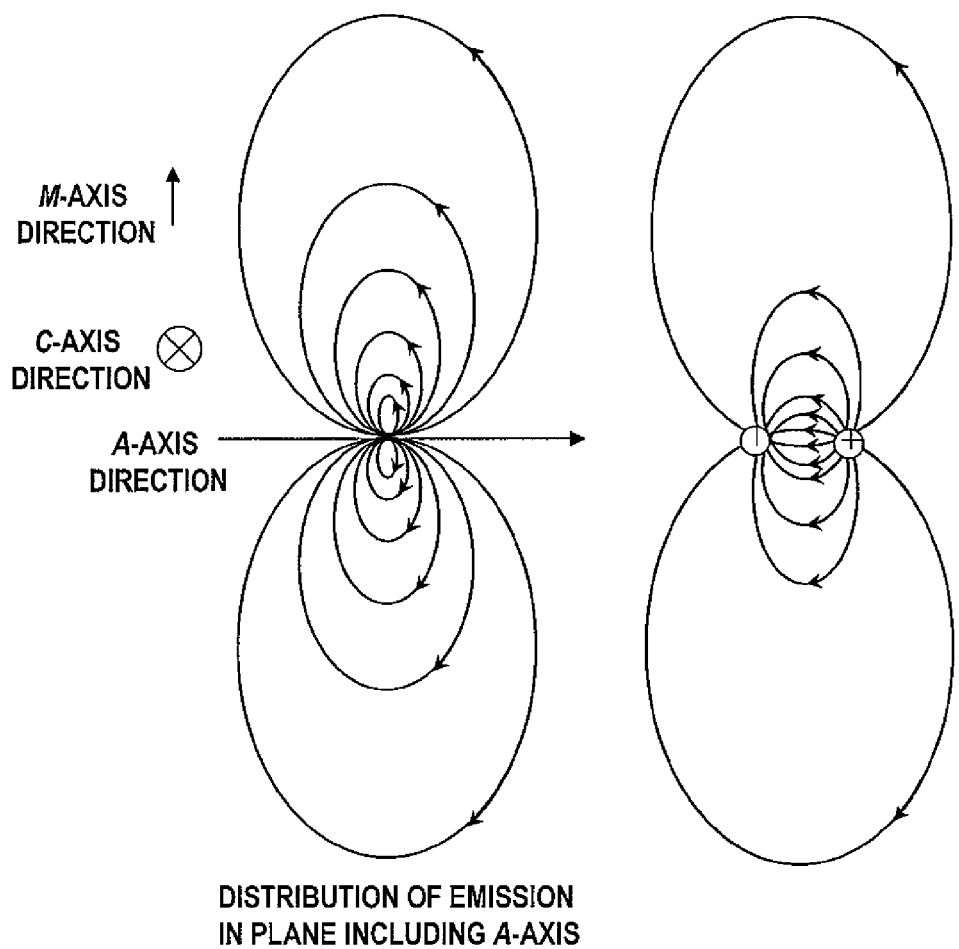
FIG. 3 is a schematic diagram of the emission distribution obtained by electric dipole vibration.

FIG. 3 shows the distribution of emitted light which is obtained by this vibratory motion of the electric dipole. As compared with the emission intensity in the vibration direction of the electric dipole, the emission intensity in a direction perpendicular to the vibration direction is strong. Therefore, light from the light-emitting layer having a principal surface which is the m-plane does not uniformly spread in a space but has an intensity distribution in which the intensity is weak in the a-axis direction but is strong in a direction perpendicular to the a-axis. This intensity distribution, as a matter of course, also affects light which is emitted from the light-emitting layer and passes through another semiconductor layer before going out of the chip. As a result, the light distribution of the chip has a deviation.

This light distribution makes it difficult to design a device which includes an m-plane LED. This is because the light distribution of a common c-plane LED is greatly different from the light distribution of the m-plane LED. The c-plane LED can be generally regarded as a point light source which has an isotropic emission intensity distribution, and the light distribution of the c-plane LED has a so-called Lambertian shape. Even if there is some deviation, it can be readily adapted to the Lambertian shape in consideration of designing of lens in a subsequent phase. Therefore, a designer of a device which includes a c-plane LED is supposed to design the device on the assumption that the light distribution has a Lambertian shape. On the other hand, the m-plane LED has a light distribution which is different from the Lambertian shape. Thus, in the case of using an m-plane LED instead of a c-plane LED, it is necessary to redesign the device.

Japanese Laid-Open Patent Publication No. 2009-218569, which has been mentioned above, improves the light distribution of the c-plane LED but fails to appropriately improve a distinctive emission distribution which is based on the emission principle of the m-plane LED. This is because the presence of a light distribution which varies depending on the axial direction is not considered. That is, this problem cannot be solved without considering the light distribution in which the intensity is strong in the c-axis and m-axis directions but is weak in the a-axis direction.

Under such circumstances, the present inventors discovered a way to improve the light distribution of a nitride-based semiconductor light-emitting element including a light-emitting layer having a principal surface which is the m-plane.

Outlines of one embodiment of the present invention are as follows.

(1) A nitride-based semiconductor light-emitting element of one embodiment of the present invention is a nitride-based semiconductor light-emitting element, including: a light-emitting layer having a growing plane which is an m-plane and which is made of a GaN-based semiconductor; and at least one radiation surface at which light from the light-emitting layer is to be radiated, wherein the radiation surface is a surface in which a plurality of protrusions are provided on the m-plane, in the radiation surface, a base of each of the plurality of protrusions is a region inside a closed curve, a shape of the base has a major axis which is a line segment extending between two points which are at most distant positions on the closed curve and a minor axis which is a line segment passing through a center of the major axis and intersecting with the major axis at right angles, and an angle between the major axis and an extending direction of an a-axis of a crystal is not more than 45°.

According to the nitride-based semiconductor light-emitting element of one embodiment of the present invention, the light distribution characteristics of light from a light-emitting layer having a principal surface which is the m-plane are close to the Lambertian shape so that the light distribution characteristics can be improved.

(2) In the above paragraph (1), the closed curve may be a convex closed curve.

(3) In the above paragraph (1) or (2), where the major axis and the closed curve intersect with each other at two points, point x1 and point x2, and the minor axis and the closed curve intersect with each other at two points, point y1 and point y2, the closed curve may be placed inside a rectangle having a sides which are formed by two straight lines respectively passing through the points x1 and x2 and being parallel to the minor axis and two straight lines respectively passing through the points y1 and y2 and being parallel to the major axis.

(4) In the above paragraph (1) or (2), the protrusions may have a crest portion, and a surface of the protrusions may be a curved surface projecting in a direction from the bottom to the crest portion.

(5) In any of the above paragraphs (1) to (4), the closed curve may be an ellipse.

(6) In any of the above paragraphs (1) to (5), the length of the major axis may be more than 1 time the length of the minor axis and may be not more than 10 times the length of the minor axis.

(7) In any of the above paragraphs (1) to (6), the length of the major axis may be not less than 0.5 μm and not more than 50 μm.

(8) In any of the above paragraphs (1) to (7), the radiation surface may be a bottom surface or a top surface of the nitride-based semiconductor light-emitting element.

(9) In any of the above paragraphs (1) to (8), the plurality of protrusions may have a shape of an elliptic cone.

(10) A light source of one embodiment of the present invention includes: the nitride-based semiconductor light-emitting element as set forth in any of the above paragraphs (1) to (9); and a wavelength converter including a phosphor that converts a wavelength of light radiated from the radiation surface.

(11) A nitride-based semiconductor light-emitting element manufacturing method of one embodiment of the present invention includes the steps of: (a) providing a substrate; (b) forming a semiconductor multilayer structure including a light-emitting layer having a growing plane which is an m-plane; and (c) forming a plurality of protrusions in a radiation surface at which light from the light-emitting layer is to be radiated, wherein in the radiation surface, a base of each of the plurality of protrusions is a region inside a closed curve, a shape of the base has a major axis which is a line segment extending between two points which are at most distant positions on the closed curve and a minor axis which is a line segment passing through a center of the major axis and intersecting with the major axis at right angles, and an angle between the major axis and an extending direction of an a-axis of a crystal is not more than 45°.

Hereinafter, exemplary embodiments of the present invention will be specifically described with reference to the drawings. In the drawings mentioned below, for the sake of simple description, elements which perform substantially the same functions are denoted by the same reference numerals. Note that the present invention is not limited to the embodiments which will be described below.

(Embodiment 1)

Figure 4A:
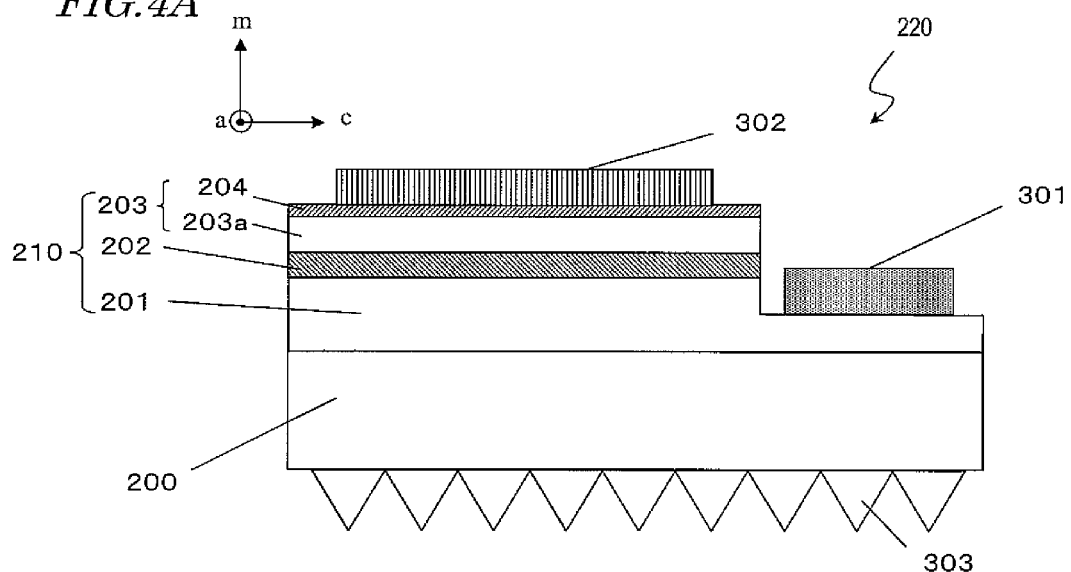
FIG. 4A is a schematic diagram showing an m-plane nitride-based semiconductor light-emitting element 220 of an exemplary embodiment.

FIG. 4A is a cross-sectional view schematically showing a nitride-based semiconductor light-emitting element 220 according to an exemplary embodiment of the present invention.

The nitride-based semiconductor light-emitting element 220 of the present embodiment includes a substrate 200 having a growing plane which is the m-plane, a multilayer structure 210 which is provided on the substrate 200 and which is made of a nitride-based semiconductor, and a p-electrode 302 and a n-electrode 301. The multilayer structure 210 includes an active layer 202.

In the case where the nitride-based semiconductor light-emitting element 200 is flip-chip mounted (face-down), the nitride-based semiconductor light-emitting element 200 is mounted to a mounting base such that the substrate 200 side is on the top side. In this case, light emitted from the active layer 202 is transmitted through the rear surface (a surface opposite to the growing plane) and the lateral surfaces of the substrate 200 so that it is extracted to the outside. In the present specification, a surface through which light from the active layer 202 is to be extracted to the outside is referred to as "radiation surface".

In the present embodiment, the rear surface of the substrate 200 is the m-plane. The rear surface of the substrate 200 has a plurality of protrusions 303.

Figure 4B:
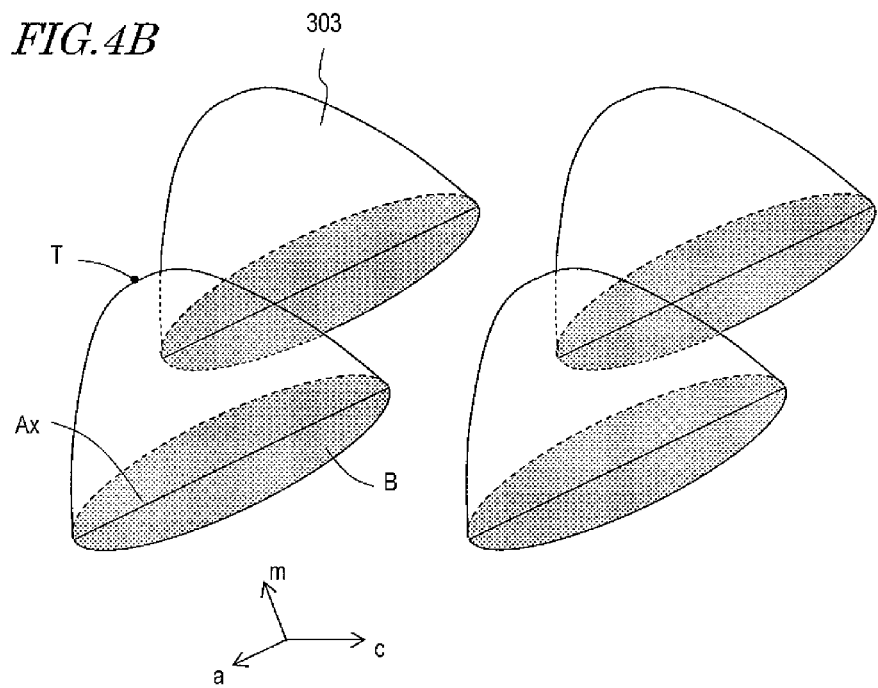
FIG. 4B is an enlarged view of protrusions 303 provided in the m-plane nitride-based semiconductor light-emitting element 220.

FIG. 4B is an enlarged view of some of the plurality of protrusions 303. The base B of the plurality of protrusions 303 is elliptical. The major axis Ax of the ellipse (a line segment extending between two points which are at most distant positions on the ellipse that forms the base B) is parallel to the a-axis direction of the crystal. In the case where a point (line or plane) on the surface of the protrusion 303 which is most distant from the base B in terms of the m-axis direction is a crest portion T, the surface of the protrusion 303 is a moderately curved surface projecting in a direction from the base B to the crest portion T.

The length of the major axis Ax of the base of the protrusions 303 is, for example, not less than 0.5 μm and not more than 50 μm. The height of the protrusions 303 is, for example, not less than 0.5 μm and not more than 50 μm.

The plurality of protrusions 303 may not have identical shapes. The size of the base B, the curvature of the lateral surface, the orientation of the protrusions 303, etc., may be different among the protrusions 303. The major axis Ax of the base B of the protrusions 303 may be inclined with respect to the a-axis. In this case, the angle between the a-axis and the major axis Ax is not more than 45°.

As described above, light from the active layer 202 having a growing plane which is the m-plane has a distribution in which the intensity is weak in the a-axis direction but is strong in a direction perpendicular to the a-axis. According to the present embodiment, the protrusions 303 are arranged such that the major axis Ax extends along a direction along the a-axis (or a direction which is inclined by an angle of not more than 45° with respect to the a-axis). Also, since the lateral surfaces of the protrusions 303 are curved surfaces, the normal directions of the lateral surfaces are, microscopically, a variety of different directions. Thus, variation in the light distribution characteristics of light from the active layer 202 can be reduced.

The shape of the protrusions 303 of the present embodiment is not limited to that shown in FIG. 4B. Hereinafter, various shapes of the protrusions 303 will be described. FIGS. 5A to 5D are diagrams that show examples of the shape of the protrusions 303 of the present embodiment.

Figure 5A:
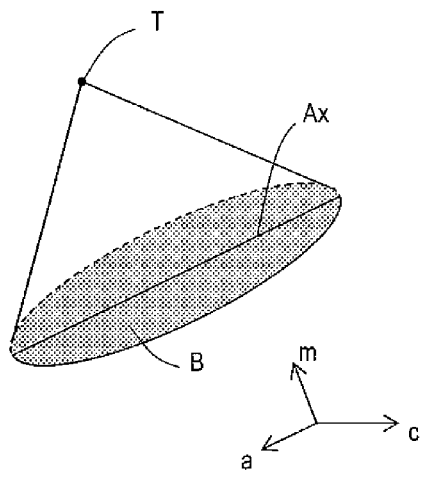
FIGS. 5A to 5D are three-dimensional illustrations of examples of the shape of the protrusions 303 of the present embodiment.
Figure 5B:
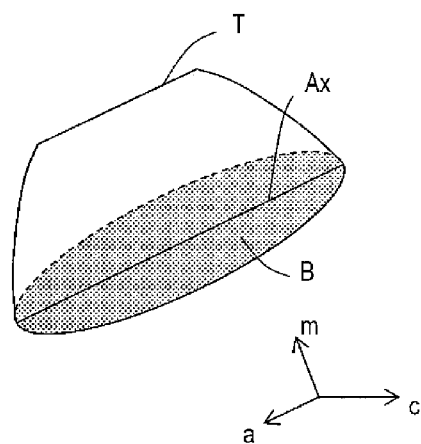

As shown in FIG. 5A, the protrusions 303 may have the shape of an elliptic cone where the base B is elliptical and the crest portion T is formed by an apex point. As shown in FIG. 5B, the crest portion T of the protrusions 303 may be formed by a line rather than a point. In this case, the crest portion T may extend along the a-axis or may be inclined with respect to the a-axis.

Figure 5C:
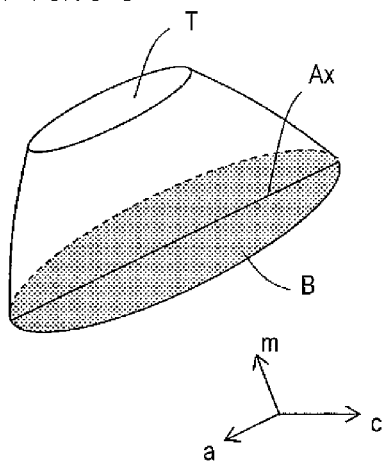

As shown in FIG. 5C, the crest portion T of the protrusions 303 may be formed by a surface rather than a point. FIG. 5C shows a shape obtained by truncating an elliptic cone at the apex. Note that, in FIG. 5C, the edge of the crest portion T is clearly shown, although the edge may not be clear. The crest portion T and the lateral surface may be joined together by a moderately curved surface.

Figure 5D:
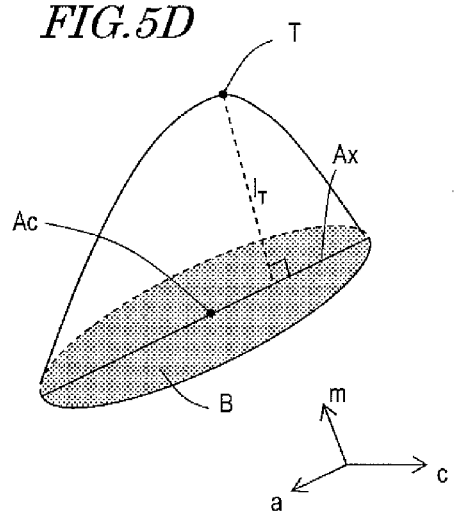

The protrusions 303 of the present embodiment may have a shape such as shown FIG. 5D. In FIG. 5D where a straight line $l_T$ is drawn vertically from the crest portion T to the base B of the protrusion 303 (a straight line extending along the m-axis direction), the intersection point of the straight line $l_T$ and the base B is not coincident with the center Ac of the major axis Ax. It may deviate in the a-axis direction from the center of the major axis Ax or may deviate from the c-axis direction.

Note that "the base B of the protrusion 303" refers to the planar shape at the bottom of the protrusion 303. For example, at the rear surface of the substrate 200 of the nitride-based semiconductor light-emitting element 220 shown in FIG. 4A, the m-plane is exposed in a region other than the bases B of the protrusions 303.

In the present embodiment, the shape of the base B of the protrusions 303 may not be elliptical. It may be a closed curve having a curvature which is different from those of ellipses. Hereinafter, the shape of the base B of the protrusions 303 is described. FIG. 6 is a diagram showing the base B of the protrusion 303. The base B of the protrusion 303 shown in FIG. 6 is a region inside the closed curve c.

As shown in FIG. 6, the shape of the base B of the protrusions 303 has the major axis Ax that is a line segment extending between two points which are at the most distant positions on the closed curve c and the minor axis Ay that is a line segment passing through the center O of the major axis Ax and intersecting with the major axis Ax at right angles. The minor axis Ay needs to be shorter than the major axis Ax. When the base B of the protrusions 303 is elliptical, the minor axis Ay is the shortest one of the line segments extending between two arbitrary points on the closed curve c. When the base of the protrusions 303 is not elliptical, the minor axis Ay may not be the shortest one of the line segments extending between two arbitrary points on the closed curve c.

According to the present embodiment, the base B of the protrusions 303 is a region inside the closed curve c and, when observed two-dimensionally, the base B has a shape elongated along the a-axis direction (or along a direction diverted from the a-axis by not more than 45'). Therefore, deviation in the light distribution characteristics of light transmitted through the radiation surface is reduced.

The closed curve c may be a convex closed curve. In the present specification, the "convex closed curve" refers to a closed curve which is defined such that a line segment extending between two arbitrary points on the closed curve would not extend out of the closed curve. For example, an ellipse is a convex closed curve. However, the closed curve c may not be a convex closed curve. Part of the closed curve c may be inwardly concaved.

As shown in FIG. 6 where the two intersection points of the major axis Ax and the closed curve c are point x1 and point x2 and the two intersection points of the minor axis Ay and the closed curve c are point y1 and point y2, the closed curve c may be placed inside a rectangle L having a sides which are formed by two straight lines respectively passing through the points x1 and x2 and being parallel to the minor axis Ay and two straight lines respectively passing through the points y1 and y2 and being parallel to the major axis Ax. Note that, however, the closed curve c may be partially placed outside the rectangle L.

Also, the closed curve c may be placed outside the straight line extending between the point x1 and the point y1, the straight line extending between the point y1 and the point x2, the straight line extending between the point x2 and the point y2, and the straight line extending between the point y2 and the point x1. Note that, however, the closed curve c may be partially placed inside these straight lines.

Next, the nitride-based semiconductor light-emitting element 220 of the present embodiment and the multilayer structure 210 that is included in the nitride-based semiconductor light-emitting element 220 are described.

Figure 7:
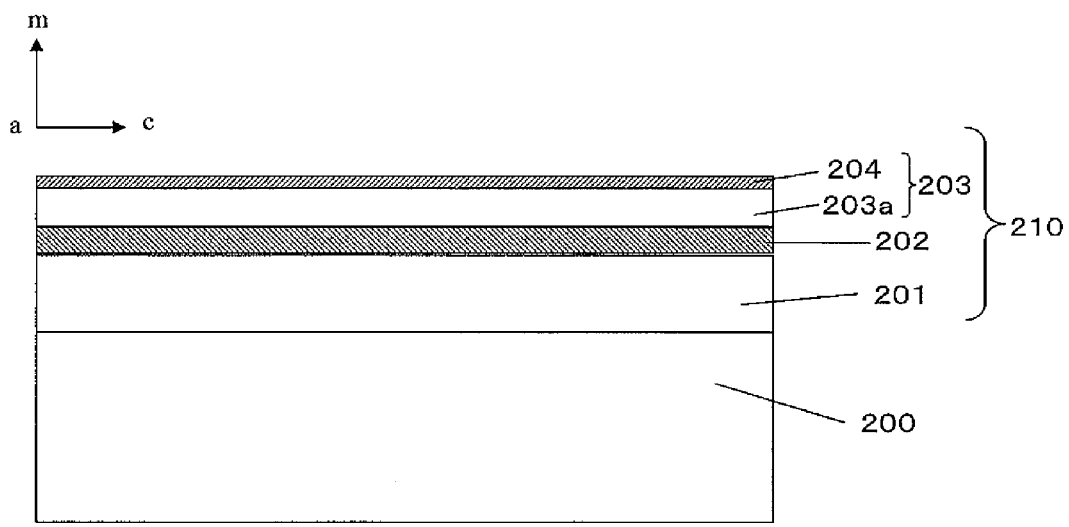
FIG. 7 is a schematic diagram showing a multilayer structure 210 of an m-plane LED of an exemplary embodiment.

FIG. 7 is a cross-sectional view schematically showing the multilayer structure 210 of an exemplary embodiment (Embodiment 1) of the present invention. The multilayer structure 210 shown in FIG. 7 is made of a GaN-based semiconductor, more specifically an $Al_xIn_yGa_zN$ (x+y+z=1, x≥0, y≥0, z≥0) semiconductor.

The multilayer structure 210 of the present embodiment is provided on a substrate 200 that is an n-type GaN substrate having a principal surface (growing plane) which is the m-plane. The multilayer structure 210 includes an n-type semiconductor layer 201 which is provided on the m-plane of the substrate 200, an active layer 202 which is provided on the n-type semiconductor layer 201 and which functions as a light-emitting region, and a p-type semiconductor layer 203 which is provided on the active layer 202. The p-type semiconductor layer 203 includes a p-type contact layer 204 in which the p-type impurity concentration is higher than that of the other portion 203a of the p-type semiconductor layer 203. The n-type semiconductor layer 201 is realized by, for example, an $Al_uGa_vIn_wN$ layer (u+v+w=1, u≥0, v≥0, w≥0). The p-type semiconductor layer 203 is realized by, for example, an $Al_dGa_eN$ layer (d+e=1, d≥0, e≥0).

The growing direction of the active layer 202 is perpendicular to the m-plane (m-plane nitride semiconductor layer). The growing plane of the active layer 202 is also parallel to the m-plane. The principal surface (growing plane) side of the p-type semiconductor layer 203 is provided with the p-type contact layer 204 in which the p-type impurity concentration is higher than that of the other portion of the p-type semiconductor layer 203. The active layer 202 includes, for example, an $Al_aIn_bGa_cN$ layer (a+b+c=1, a≥0, b≥0, c≥0). Between the active layer 202 and the p-type semiconductor layer 203, an overflow stopper layer (OFS layer) which is realized by an AlGaN layer may be provided.

Next, a method for manufacturing the nitride-based semiconductor light-emitting element 220 according to the present embodiment is described.

First, a multilayer structure 210 is formed as shown in FIG. 7. The multilayer structure 210 can be formed using a common technique. For example, the multilayer structure 210 is formed by providing a substrate 200 and sequentially depositing on the substrate 200 a n-type semiconductor layer 201, an active layer (light-emitting layer) 202, and a p-type semiconductor layer 203 using a technique called MOCVD (Metal Organic Chemical Vapor phase Deposition) or MOVPE (Metal Organic Vapor Phase Epitaxy).

After completion of the crystal growth process for formation of the multilayer structure 210, steps called pretreatment steps, process steps, etc., are performed in order to form the nitride-based semiconductor light-emitting element 220 shown in FIG. 4A. Here, common semiconductor process techniques, such as washing, photography, etching, electrode formation, etc., are performed for formation of a device. In the case of an LED, since the LED is a device which is capable of producing light by means of an electric current flowing through the pn junction, the major steps include formation of a region for the n-electrode, formation of a n-electrode 301, and formation of a p-electrode 302.

Typically, the protrusions 303 of the light extraction surface are formed after completion of formation of the nitride-based semiconductor light-emitting element 220. First, the substrate 200 is ground such that its thickness is reduced. The thickness of the substrate 200 is determined in consideration of the strength of the chip, the light extraction efficiency, etc., and may be, for example, about 5 µm to 200 µm. For example, in the case where the thickness of the substrate 200 is reduced to 10 µm and protrusions having a height greater than that thickness are formed, the substrate 200 would not remain at the rear surface of the nitride-based semiconductor light-emitting element 220. Therefore, the nitride-based semiconductor light-emitting element 220 may not necessarily include the substrate 200. After completion of grinding, a plurality of protrusions 303 are formed in the rear surface of the substrate 200 which is the radiation surface (light extraction surface), i.e., a surface of the substrate 200 which is opposite to the growing plane. Firstly, a resist film is applied over the rear surface of the substrate 200, and a glass mask which has a predetermined pattern is aligned, before light is applied at a wavelength which is capable of exposure of the resist film. The resultant structure is developed using a predetermined development solution, whereby a predetermined pattern is obtained. Performing a dry etching process using the pattern of the resist film as a mask enables formation of a predetermined recessese/protrusion structure across the rear surface of the substrate 200.

For example, to form the protrusions 303 so as to have the shape of an elliptic cone (or the shape of an elliptic pole having a rounded upper edge), a resist mask in the shape of an elliptic pole (pole shape) is formed, and thereafter, baking is performed at a high temperature (e.g., from 150° C. to 250° C.). Heating at the high temperature deforms the resist mask so that the corner portion of the elliptic pole of the resist mask is rounded. By performing etching using such a resist mask, the protrusions 303 which have the same shape as that of the resist mask can be formed over the rear surface of the substrate 200. Alternatively, by performing exposure using a grayscale mask, the resist mask can be formed to have a predetermined shape.

Since the resist mask can be patterned in the photography step, using the resist mask can particularly improve the production yield. However, the mask used for dry etching may be an inorganic film which is made of $SiO_2$ or SiN, a metal film of Pt, Ni, or Cr, or an organic film which is made of polyimide.

In the present embodiment, a resin sheet which has the protrusions 303 may be adhered instead of forming the protrusions 303 by etching.

Then, the resultant structure is diced into chips by laser dicing and the chips are mounted to mounting bases of alumina or aluminum nitride. The light distribution characteristics of the mounted nitride-based semiconductor light-emitting elements are evaluated by measuring the intensity distribution of emitted light at various angles with the use of a device for varying the angle, which is called a goniometer.

The present inventors carried out simulations to calculate the light distribution characteristics of the nitride-based semiconductor light-emitting element manufactured by the above-described method. Next, the calculation results are described. The light distribution was calculated by simulation according to a ray tracing method. A common ray tracing simulation was carried out except that a light source which had anisotropy in terms of the axial direction in the light-emitting layer was used. Also, the simulation was carried out on the assumption that a resin which covers the nitride-based semiconductor light-emitting element and a phosphor are not provided so that light is directly extracted from the chip to the air.

Figure 8:
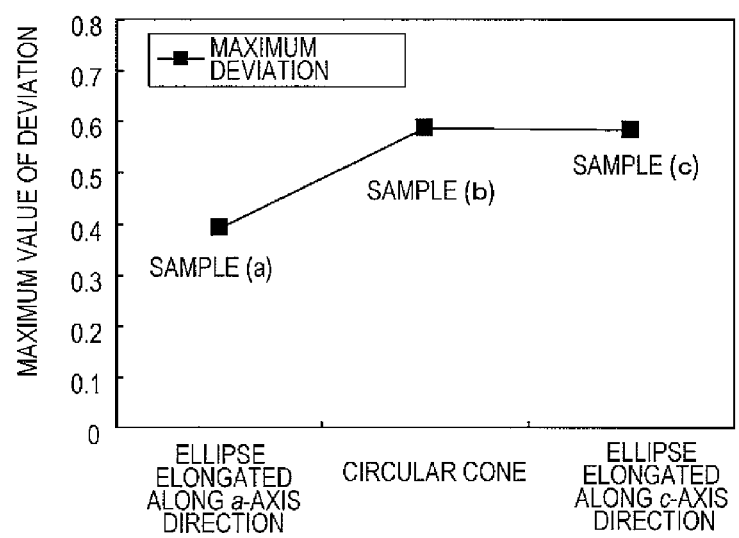
FIG. 8 is a graph showing the maximum values of the deviation from the Lambertian shape in Samples (a) to (c) among which the direction of the major axis of the protrusions is different.

FIG. 8 is a graph showing the light distribution characteristics for a sample where the protrusions have the shape of a circular cone, a sample where the protrusions have the shape of an elliptic cone elongated along the a-axis direction, and a sample where the protrusions have the shape of an elliptic cone elongated along the c-axis direction. Sample (a) of FIG. 8 has a configuration where elliptic cones elongated along the a-axis direction (the minor axis of the ellipse is 4 µm, and the major axis is 25 µm) are arranged so as to entirely cover the rear surface. Sample (b) has a configuration where circular cones having a diameter of 10 µm are arranged with intervals of 10 µm so as to entirely cover the rear surface. Sample (c) has a configuration where elliptic cones elongated along the c-axis direction (the minor axis of the ellipse is 4 µm, and the major axis is 25 µm) are arranged so as to entirely cover the rear surface.

For each of the angles, the amount of deviation from the normalized Lambertian shape was calculated. The maximum values among the calculated deviation amounts for the respective angles were plotted on the graph. Calculation of the deviation amount was realized by calculating the value of the amount of light on the assumption that the amount of light in the case of the Lambertian shape is 1, and subtracting the calculated value of the amount of light from the amount of light of the Lambertian shape.

As seen from FIG. 8, the deviation amount of Sample (c) that had the elliptic cones elongated along the c-axis direction was generally equal to that of Sample (b) that had the circular cones. However, the deviation amount of Sample (a) that had the elliptic cones elongated along the a-axis direction was smaller than those of Samples (b) and (c).

Figure 9:
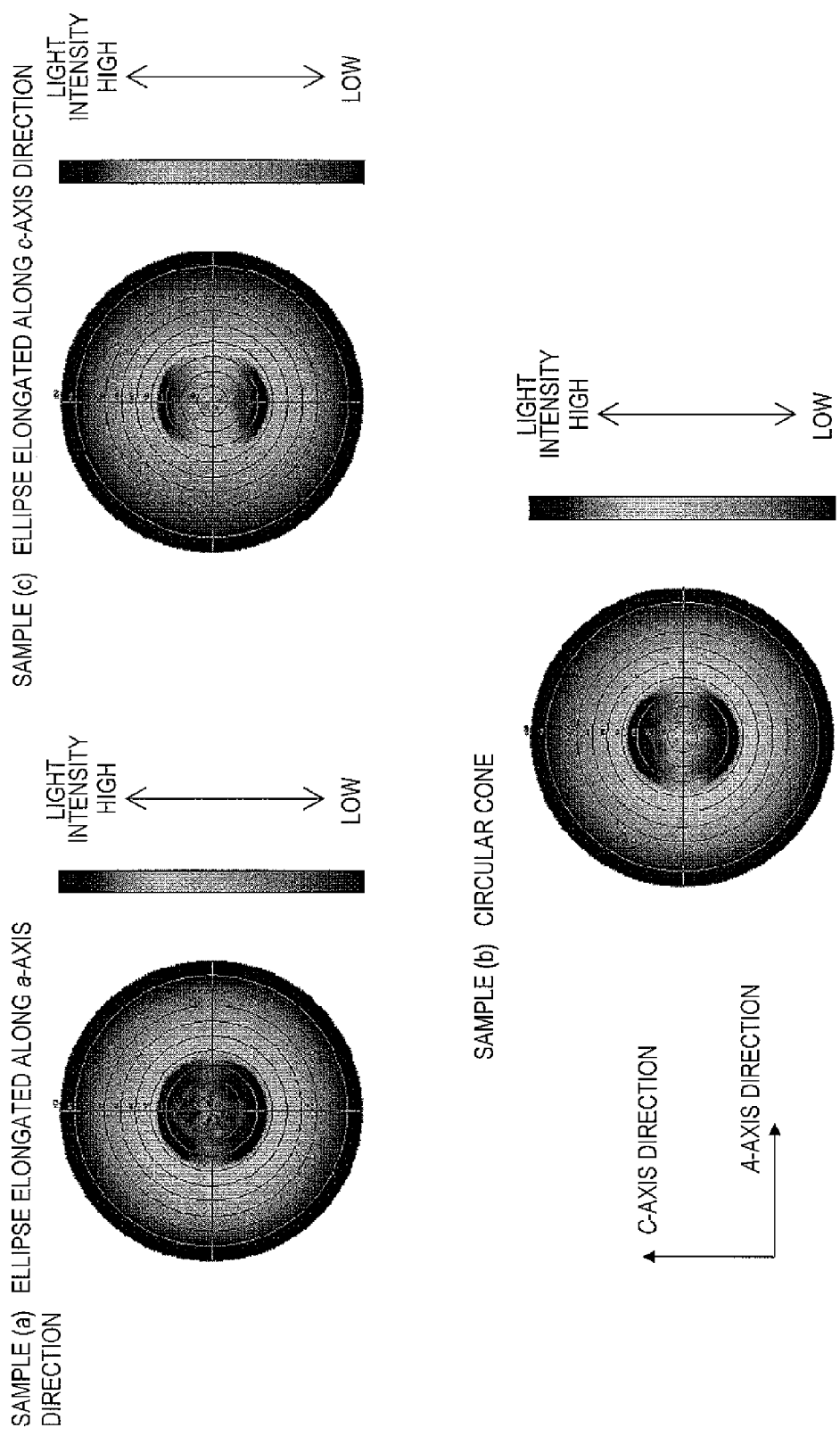
FIG. 9 is a diagram showing the radial light distributions of Samples (a) to (c).

FIG. 9 shows the radial light distributions of Samples (a) to (c) which were obtained by simulation. In these radial distributions, it can be said that the light distribution characteristic is higher as the light intensity is more uniform in all radial directions including the a-axis direction and the c-axis direction. As seen from FIG. 9, in Sample (c) that had the elliptic cones elongated along the c-axis direction, the difference in light intensity between the a-axis direction and the c-axis direction was large. It can be seen that the radial distribution of Sample (c) was worse than that of Sample (b) that had the circular cones. On the other hand, in Sample (a) that had the elliptic cones elongated along the a-axis direction, the difference in light intensity between the a-axis direction and the c-axis direction was obviously smaller than that of Sample (b) that had the circular cones. It can be seen from these results that, in Sample (a), the light intensity was uniform in all radial directions, and the light distribution was obviously improved. From the above results, it can be seen that the light distribution is more improved when the major axis of the ellipse that forms the base of the protrusions extends along the a-axis direction than along the c-axis direction. The major axis of the ellipse may be diverted from the a-axis direction. The angle between the major axis and the a-axis direction may be not more than 45°. The angle between the major axis and the a-axis direction may be not more than 15°.

Figure 10:
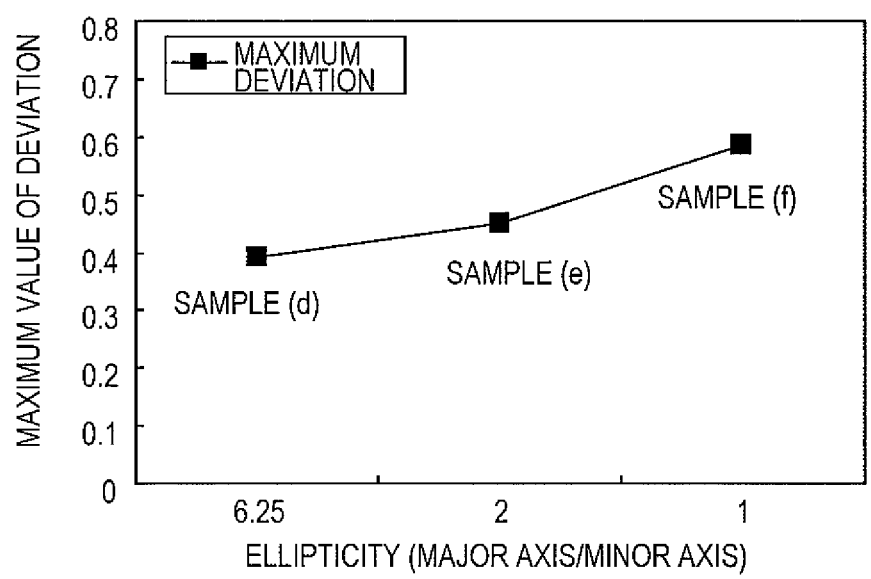
FIG. 10 is a graph showing the maximum values of the deviation from the Lambertian shape in Samples (d) to (f) among which the ellipticity is different where the ratio between the major axis and the minor axis of an ellipse is defined as the ellipticity.

We also calculated the light distribution characteristics with varying ratios between the major axis and the minor axis of an ellipse that forms the base of the protrusions. Now, the results of the calculation are described. FIG. 10 is a graph on which the amount of deviation of the light distribution from the Lambertian shape for Sample (f) having an ellipticity of 1 (circular cones), Sample (e) having an ellipticity of 2 (the major axis of the ellipse was 14 μm, and the minor axis was 7 μm), and Sample (d) having an ellipticity of 6.25 (the major axis of the ellipse was 25 μm, and the minor axis was 4 μm) was plotted, where the ellipticity is defined by the ratio between the major axis and the minor axis of the ellipse. Likewise as in FIG. 8, the amount of deviation from the normalized Lambertian shape was calculated for each of the angles, and the maximum values among the calculated deviation amounts for the respective angles were plotted on the graph.

In respective ones of Samples (d) to (f), the size of the protrusions was adjusted such that the samples had equal density values of the protrusions. The density of the protrusions was about 70%. As seen from FIG. 10, as the ellipticity increased, the maximum value of the deviation amount decreased.

Figure 11:
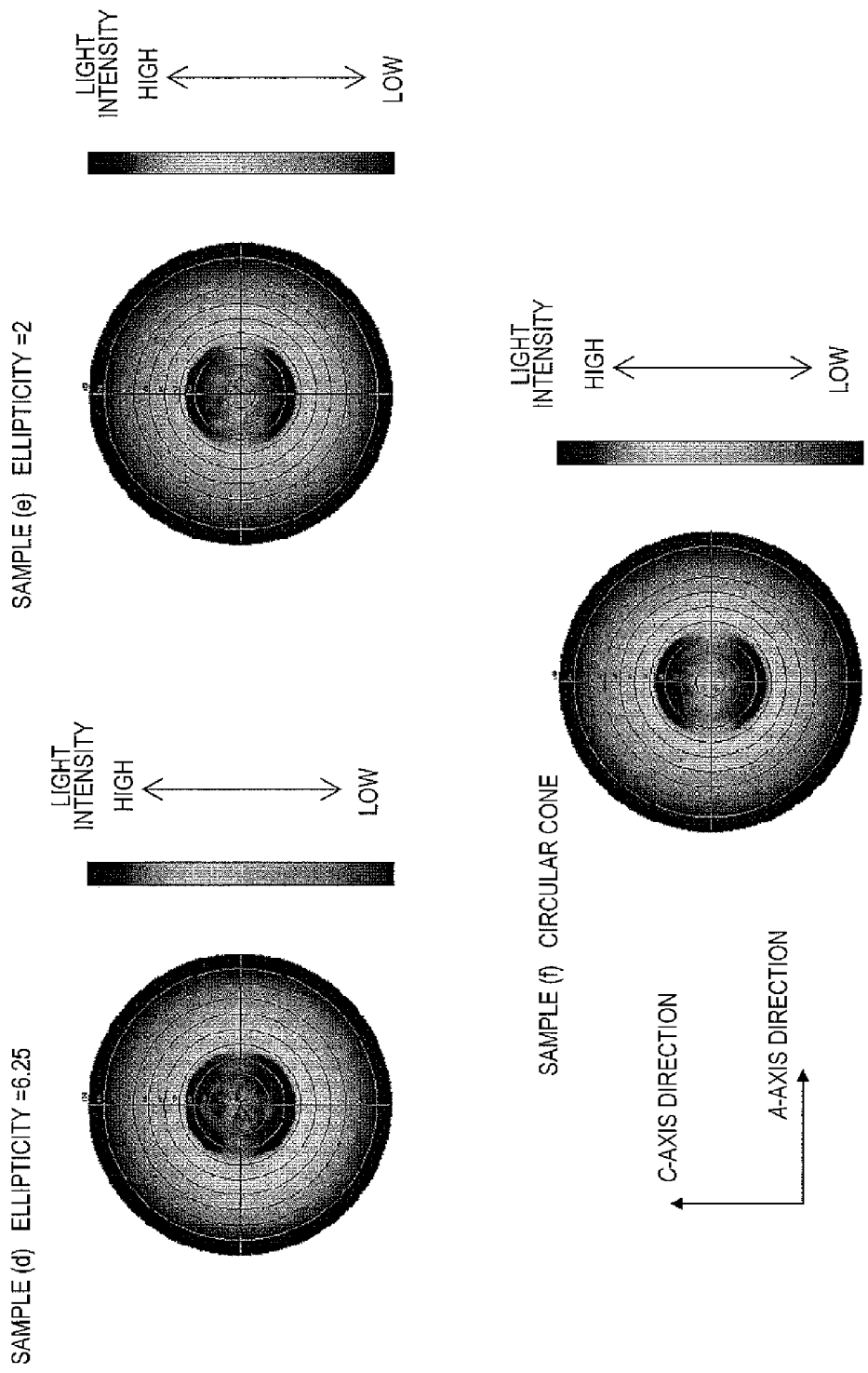
FIG. 11 is a diagram showing the radial light distributions of Samples (d) to (f).

The radial light distributions of Samples (d) to (e) are shown in FIG. 11. It is also seen from FIG. 11 that, as the ellipticity increased, the light intensity was more uniform in all radial directions. Although a greater ellipticity may be used, manufacture would be difficult when the ellipticity is greater than 10. For example, when the ellipticity is 15 and the minor axis is 4 μm, the major axis will be 60 μm. One side of the chip is, for example, not less than 100 μm and not more than 3000 μm, or not less than 100 μm and not more than 1000 μm. When the major axis is 60 μm, it is difficult to arrange a plurality of protrusions across the chip. Therefore, it is considered that the practical upper limit of the ellipticity is about 10.

Figure 12:
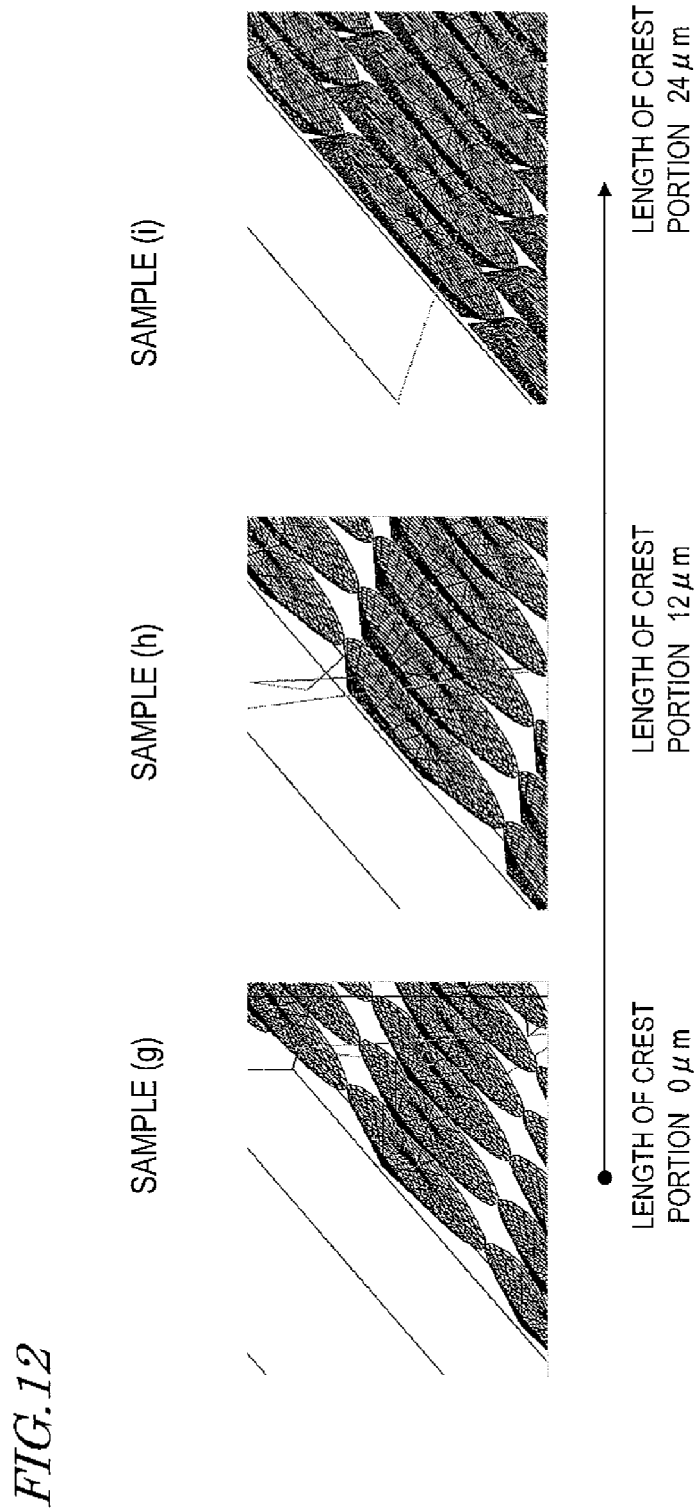
FIG. 12 shows bird's-eye views of Samples (g) to (i) among which the length of the crest portion of the elliptic cones (the length along the major axis) is different.

Next, the results of researches on the shape of the crest portion of the elliptic cones are described. FIG. 12 shows bird's-eye views of Samples (g) to (i) among which the length of the crest portion of the elliptic cones (the length of the crest portion along the major axis) is different.

FIG. 12 shows Sample (g) which had elliptic cones having the crest portion length of 0 μm, i.e., having the crest portion being regarded as a point, Sample (h) which had elliptic cones with the crest portion length of 12 μm, and Sample (i) which had elliptic cones with the crest portion length of 24 μm. Note that, in each of the samples, the width of the crest portion (a width along a direction perpendicular to the length direction) was assumed as 0. The major axis of the base of each sample was 25 μm. The length of the minor axis of each sample was 4 μm.

Figure 13:
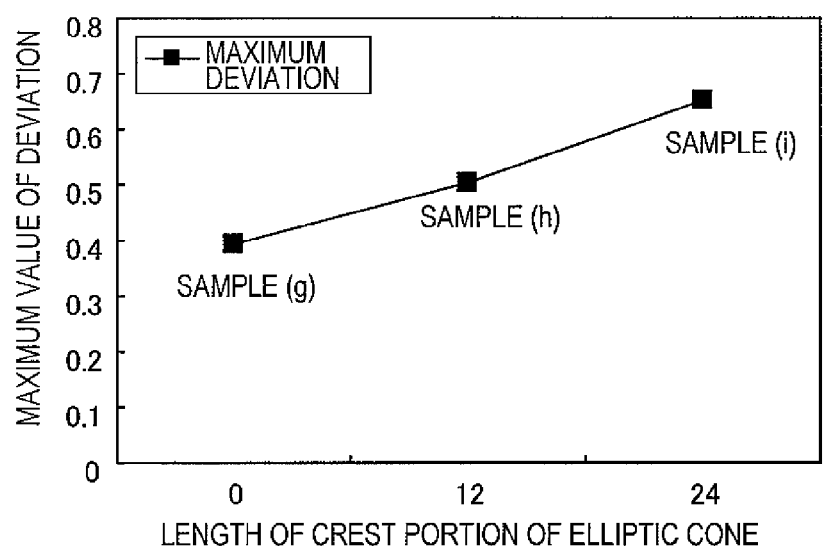
FIG. 13 is a graph showing the maximum values of the amount of deviation of the light distributions of Samples (g) to (i) from the Lambertian shape.

FIG. 13 is a graph on which the maximum values of the amount of deviation of the light distribution of Samples (g) to (i) from the Lambertian shape were plotted. Likewise as in FIG. 8, the amount of deviation from the normalized Lambertian shape was calculated for each of the angles, and the maximum values among the calculated deviation amounts for the respective angles were plotted on the graph.

Figure 14:
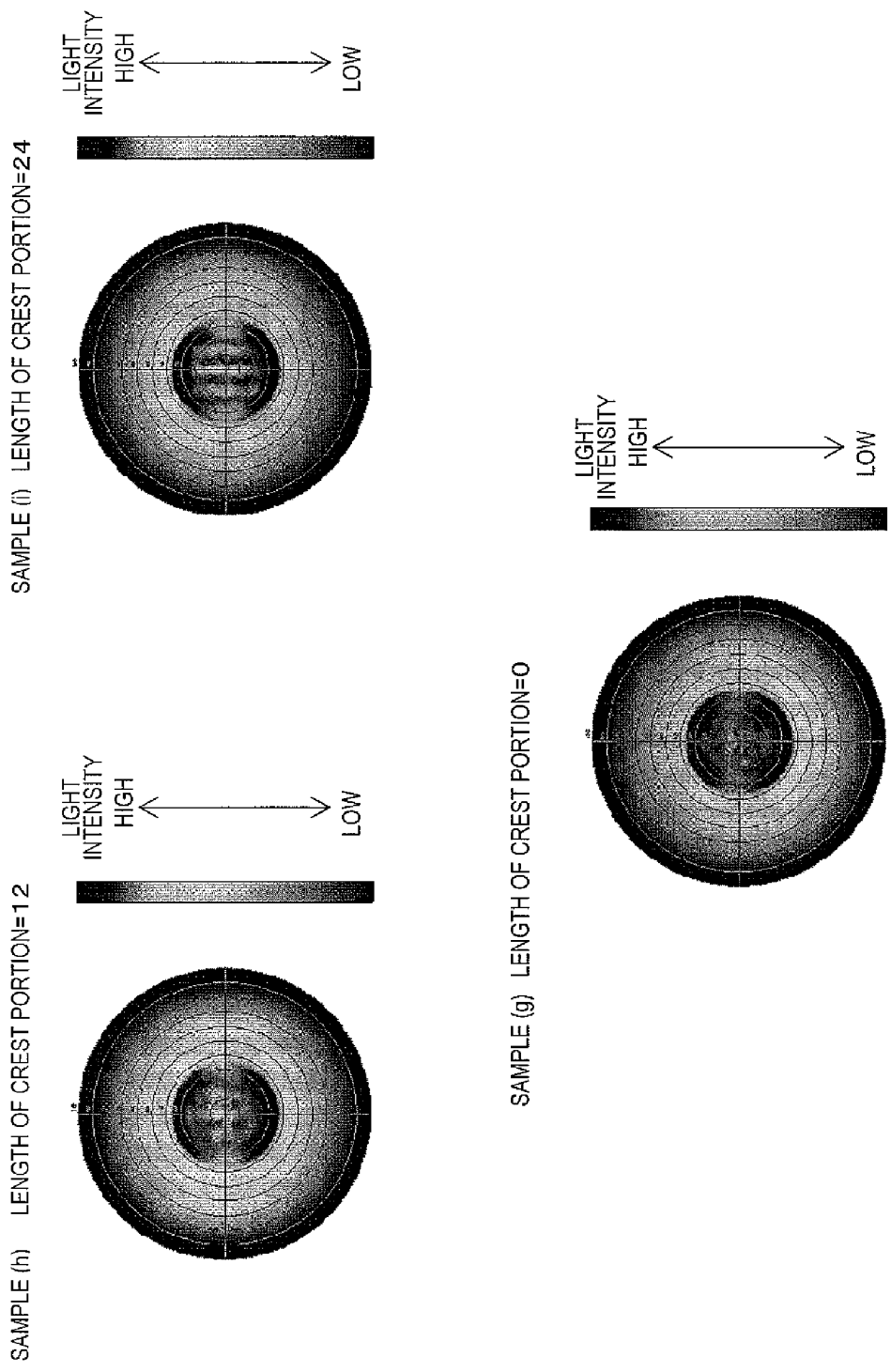
FIG. 14 is a diagram showing the radial light distributions of Samples (g) to (i).

As seen from FIG. 13, as the length of the crest portion decreases, the maximum value of the deviation amount decreases. FIG. 14 shows the radial distributions of sample light distributions obtained by simulation. It can also be seen from FIG. 14 that, as the length of the crest portion decreases, the maximum value of the deviation amount decreases. When the length of the crest portion is 12 μm, the maximum value of the deviation is 0.5. As seen from the maximum values of the deviation amount and the radial light distributions, the light distribution characteristics can be further improved when the length of the crest portion is not more than 12 μm, i.e., when the length of the crest portion is not more than ½ of the major axis.

The size of the protrusions 303 is, for example, not less than 0.5 μm and not more than 50 μm. This is because the results of the ray tracing simulation employed in the present embodiment were such that the effects on polarization did not vary even when only the size of the protrusions 303 was varied while they had the same shape (similar shapes). If the protrusions 303 are generally equal to or smaller than the wavelength (in the case of visible emission, about 0.5 μm), light begins to exhibit wave-like properties. The length of the major axis at the base of the protrusions 303 is, for example, not more than about 1/10 of the chip size. Therefore, when the chip size is 500 μm, for example, the length of the major axis at the base of the protrusions 303 is not more than 50 μm.

When the height of the protrusions is not less than 0.5 μm, the amount of light which is incident on the protrusions is sufficiently large, and therefore, the light distribution characteristics can be sufficiently improved. When the height of the protrusions is not more than 50 μm, the difficulty in manufacture which would occur if the value of the height relative to the base is excessively large can be avoided.

Figure 15A:
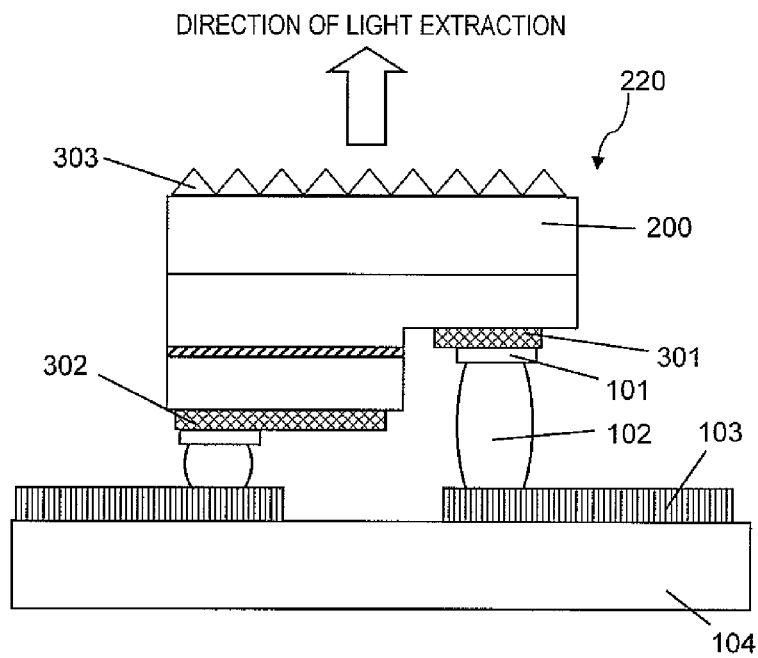
FIG. 15A shows a face-down mounting example.

The nitride-based semiconductor light-emitting element 220 shown in FIG. 4A is mounted in a face-down configuration as shown in FIG. 15A. In this case, light is radiated from the rear surface side (radiation surface side) of the substrate 200 of the nitride-based semiconductor light-emitting element 220. The n-electrode 301 and the p-electrode 302, which are provided on the growing plane side (principal surface side) of the nitride-based semiconductor light-emitting element 200, are connected to a wiring 103 provided on a mounting base 104 via pad electrodes 101 and bumps 102.

Figure 15B:
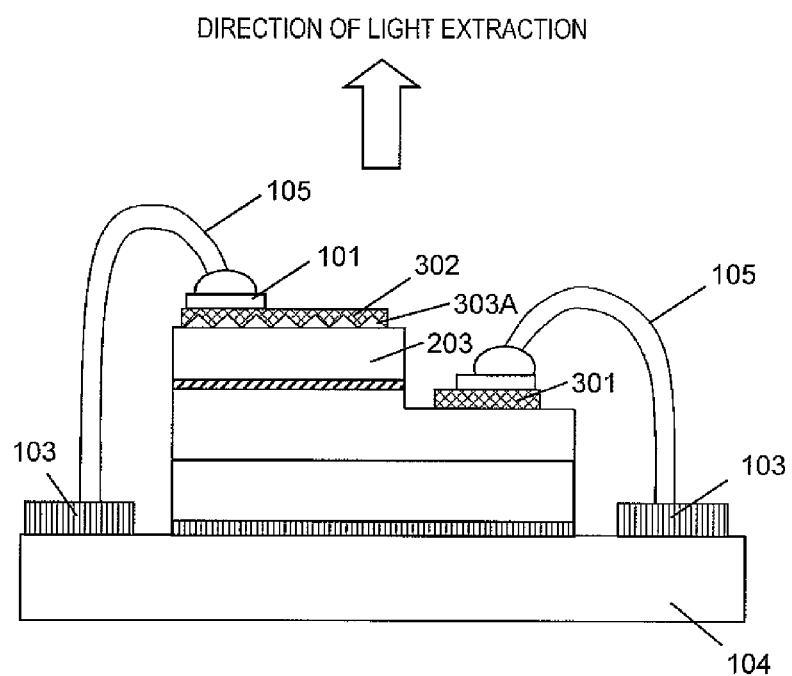
FIG. 15B shows a face-up mounting example.

In the present embodiment, the nitride semiconductor light-emitting element may be mounted in a face-up configuration. FIG. 15B is a cross-sectional view showing a face-up mounting example. In FIG. 15B, protrusions 303A are provided over the growing plane of the p-type semiconductor layer 203. In this case, light is radiated from the p-electrode 302 side, and therefore, the growing plane (top surface) of the p-type semiconductor layer 203 is a light radiation surface. The protrusions 303A provided over the growing plane of the p-type semiconductor layer 203 are covered with the p-electrode 302. The n-electrode 301 and the p-electrode 302 are in contact with pad electrodes 101. The pad electrodes 101 are connected to the wiring 103 provided on the mounting base 104 via wires 105. In the case of such a face-up type, it is necessary to extract light through the p-electrode 302. Therefore, the p-electrode 302 may be realized by a transparent electrode of ITO or an ultrathin film of Ni.

Figure 16:
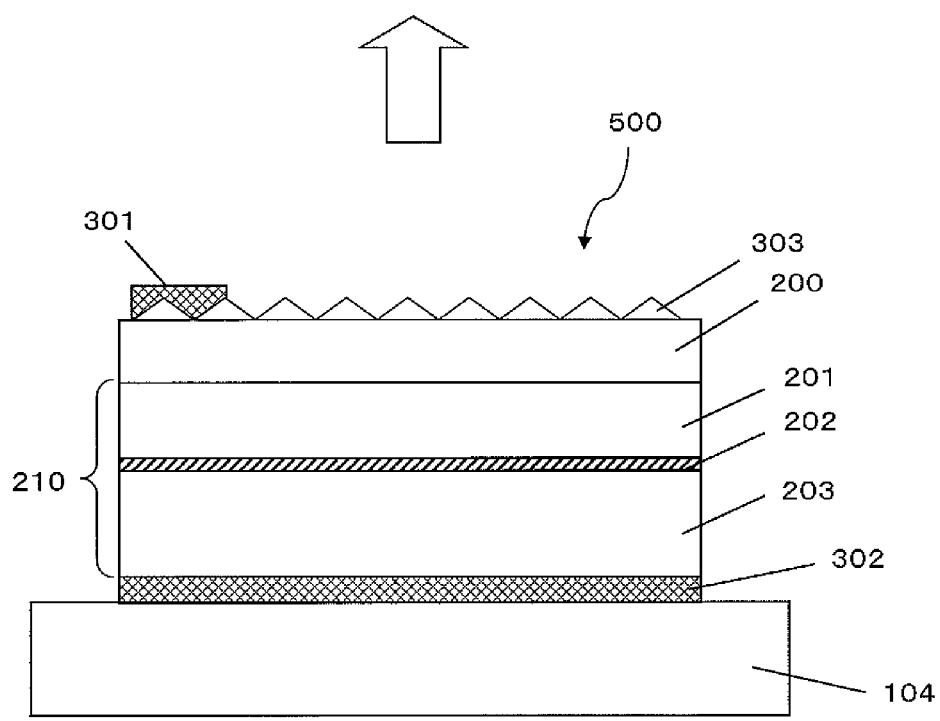
FIG. 16 is a cross-sectional view showing a vertical type nitride-based semiconductor light-emitting element 500.

In the foregoing, a horizontal type nitride-based semiconductor light-emitting element has been described, although a vertical type device may be formed in the present embodiment. FIG. 16 is a cross-sectional view showing a vertical type nitride-based semiconductor light-emitting element 500 which is a variation of the exemplary embodiment of the present invention.

The nitride-based semiconductor light-emitting element 500 shown in FIG. 16 also includes a substrate 200 having a growing plane which is the m-plane, a multilayer structure 210 which is made of a nitride-based semiconductor, and a p-electrode 302 and a n-electrode 301, as does the nitride-based semiconductor light-emitting element 220 shown in FIG. 4A. In the nitride-based semiconductor light-emitting element 500, the n-electrode 301 is provided on a side of the substrate 200 which is opposite to the surface that is in contact with the multilayer structure 210 (i.e., on the rear surface side of the substrate 200). The p-electrode 302 is provided so as to entirely cover a surface of the p-type semiconductor layer 203 which is opposite to the surface that is in contact with the active layer 202.

In the nitride-based semiconductor light-emitting element 500 of FIG. 16, the direction of light extraction is on the substrate 200 side. Light is extracted from the rear surface of the substrate 200. The rear surface of the substrate 200 is provided with the protrusions 303. The protrusions 303 may also be, or may not be, provided between the substrate 200 and the n-electrode 301. For the p-electrode 302, a metal of high reflectance, for example, Ag, may be used.

The nitride-based semiconductor light-emitting element 500 is combined with the mounting base 104 such that the p-electrode 302 is on the bottom side. For the mounting base 104, a material which has electrical conductivity and high thermal conductivity may be used. For example, for the mounting base 104, silicon, germanium, copper or aluminum may be used.

In the case of the vertical type, it is important whether or not the substrate 200 has electrical conductivity. For example, when an m-plane sapphire substrate is used as the substrate 200, the vertical type configuration cannot be employed because the m-plane sapphire substrate has an insulating property. However, when a n-type GaN substrate which has electrical conductivity is used as the substrate 200, the vertical type configuration can be employed. Alternatively, the substrate 200 may be peeled away such that the n-electrode 301 is in contact with the n-type semiconductor layer 201. In the case where the substrate 200 is peeled away, for example, a sheet which has the protrusions 303 may be adhered onto the rear surface of the n-type semiconductor layer 201.

Figure 17:
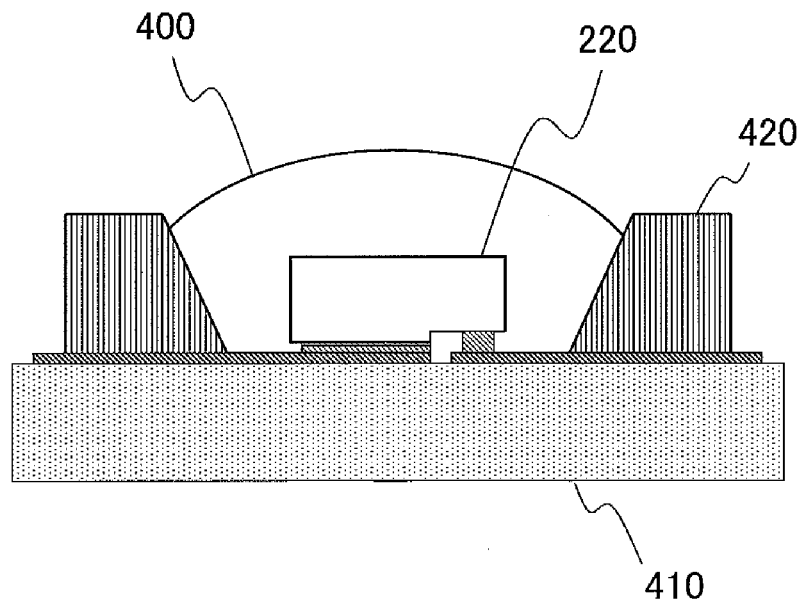
FIG. 17 is a schematic diagram showing an example of a white light source which includes a nitride-based semiconductor light-emitting element 200 according to an exemplary embodiment.

FIG. 17 is a schematic diagram showing an example of a white light source which includes the nitride-based semiconductor light-emitting element 200 of the present embodiment. The light source shown in FIG. 17 includes the nitride-based semiconductor light-emitting element 220 that has the structure shown in FIG. 4A and a resin layer 400 in which a phosphor such as YAG (Yttrium Aluminum Garnet) is dispersed to change the wavelength of the light emitted from the light-emitting element 220 into a longer one. The light-emitting element 220 is mounted on a supporting member 410 on which a wiring pattern has been formed. And on the supporting member 410, a reflective member 420 is arranged so as to surround the light-emitting element 220. The resin layer 400 has been formed so as to cover the light-emitting element 220. Note that, in FIG. 17, illustration of the protrusions 303 provided in the light-emitting element 220 is omitted.

In the embodiments described above, the p-type semiconductor region that is in contact with the p-electrode 302 is supposed to be made of GaN or AlGaN. However, the p-type semiconductor region may be a layer including In, such as an InGaN layer, for example. In that case, the contact layer that is in contact with the p-electrode 302 may be made of "$In_{0.2}Ga_{0.8}N$" in which the In mole fraction is 0.2, for example. If In is included in GaN, the bandgap of $Al_aGa_bN$ (where a+b=1, a≥0 and >0) can be smaller than that of GaN, and therefore, the contact resistance can be reduced as a result. Consequently, the p-type semiconductor region that is in contact with the p-electrode 302 may be made of an $Al_x In_y Ga_z N$ semiconductor (where x+y+z=1, x≥0, y≥0 and z≥0).

An actual m-plane growing plane or light radiation surface does not need to be perfectly parallel to the m-plane but may be inclined with respect to the m-plane by a predetermined angle. The angle of the inclination is defined by an angle formed by the normal line to the growing plane or light radiation surface of the nitride semiconductor layer and the normal line to the m-plane. The absolute value of the inclination angle θ may be not more than 5°, or not more than 1°, in the c-axis direction. In the a-axis direction, the absolute value of the inclination angle θ may be not more than 5°, or not more than 1°. With such inclination angles, the growing plane or light radiation surface of the nitride semiconductor layer, as a whole, is inclined with respect to the m-plane. However, upon closer observation, a large number of m-plane regions are exposed over the growing plane or light radiation surface. That is, the growing plane or light radiation surface of the nitride semiconductor layer has a plurality of stepped m-plane regions. Thus, it is expected that a plane which is inclined with respect to the m-plane by an angle of not more than 5° (absolute value) has the same characteristics as those of the m-plane. When the absolute value of the inclination angle θ is smaller than 5°, decrease of the internal quantum efficiency which is attributed to a piezoelectric field can be prevented. Therefore, the "m-plane" of the invention of the present application includes a plane in which the absolute value of the inclination angle θ is not more than 5° in the c-axis direction and not more than 5° in the a-axis direction and a plane which includes a plurality of stepped m-plane regions.

In the foregoing, the present invention has been described with an exemplary embodiment, although the above description does not intend to provide limitations. As a matter of course, various modifications are possible.

A semiconductor light-emitting element according to one embodiment of the present invention is applicable to uses which employ LEDs, such as general lighting devices, headlights for automobiles, backlights for liquid crystal devices, for example.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A nitride-based semiconductor light-emitting element, comprising:
    a light-emitting layer having a growing plane which is an m-plane and being made of a GaN-based semiconductor; and
    at least one radiation surface at which light from the light-emitting layer is to be radiated,
    wherein the radiation surface is a surface in which a plurality of protrusions are provided on the m-plane,
    in the radiation surface, a base of each of the plurality of protrusions is a region inside a closed curve,
    a shape of the base is an elliptical shape having a major axis which is a line segment extending between two points which are at most distant positions on the closed curve and a minor axis which is a line segment passing through a center of the major axis and intersecting with the major axis at right angles,
    an ellipticity of the base of each of the plurality of the protrusions falls within the range of not less than 2 and not more than 6.25, the ellipticity defined by a ratio between the major axis and the minor axis of the base, and
    an angle between the major axis and an extending direction of an a-axis of a crystal is not more than 45°.

2. The nitride-based semiconductor light-emitting element of claim 1, wherein the closed curve is a convex closed curve.

3. The nitride-based semiconductor light-emitting element of claim 1, wherein, where the major axis and the closed curve intersect with each other at two points, point x1 and point x2, and the minor axis and the closed curve intersect with each other at two points, point y1 and point y2, the closed curve is placed inside a rectangle having sides which are formed by two straight lines respectively passing through the points x1 and x2 and being parallel to the minor axis and two straight lines respectively passing through the points y1 and y2 and being are parallel to the major axis.

4. The nitride-based semiconductor light-emitting element of claim 1, wherein
    the protrusions have a crest portion, and
    a surface of the protrusions is a curved surface projecting in a direction from the bottom to the crest portion.

5. The nitride-based semiconductor light-emitting element of claim 1, wherein the length of the major axis is more than 1 time the length of the minor axis and is not more than 10 times the length of the minor axis.

6. The nitride-based semiconductor light-emitting element of claim 1, wherein the length of the major axis is not less than 0.5 μm and not more than 50 μm.

7. The nitride-based semiconductor light-emitting element of claim 1, wherein the radiation surface is a bottom surface or a top surface of the nitride-based semiconductor light-emitting element.

8. The nitride-based semiconductor light-emitting element of claim 1, wherein the plurality of protrusions have a shape of an elliptic cone.

9. A light source, comprising:
    a nitride-based semiconductor light-emitting element, comprising:
        a light-emitting layer having a growing plane which is an m-plane and being made of a GaN-based semiconductor; and
        at least one radiation surface at which light from the light-emitting layer is to be radiated,
        wherein the radiation surface is a surface in which a plurality of protrusions are provided on the m-plane,
        in the radiation surface, a base of each of the plurality of protrusions is a region inside a closed curve,
        a shape of the base is an elliptical shape having a major axis which is a line segment extending between two points which are at most distant positions on the closed curve and a minor axis which is a line segment passing through a center of the major axis and intersecting with the major axis at right angles,
        an ellipticity of the base of each of the plurality of the protrusions falls within the range of not less than 2 and not more than 6.25, the ellipticity defined by a ratio between the major axis and the minor axis of the base, and
        an angle between the major axis and an extending direction of an a-axis of a crystal is not more than 45°; and
    a wavelength converter including a phosphor that converts a wavelength of light radiated from the radiation surface.

10. A method for manufacturing a nitride-based semiconductor light-emitting element, comprising the steps of:
    (a) providing a substrate;
    (b) forming a semiconductor multilayer structure including a light-emitting layer having a growing plane which is an m-plane; and
    (c) forming a plurality of protrusions in a radiation surface at which light from the light-emitting layer is to be radiated, wherein
    in the radiation surface, a base of each of the plurality of protrusions is a region inside a closed curve,
    a shape of the base is an elliptical shape having a major axis which is a line segment extending between two points which are at most distant positions on the closed curve and a minor axis which is a line segment passing through a center of the major axis and intersecting with the major axis at right angles,
    an ellipticity of the base of each of the plurality of the protrusions falls within the range of not less than 2 and not more than 6.25, the ellipticity defined by a ratio between the major axis and the minor axis of the base, and
    an angle between the major axis and an extending direction of an a-axis of a crystal is not more than 45°.

* * * * *